(12) United States Patent
Weber et al.

(10) Patent No.: US 11,334,263 B2
(45) Date of Patent: *May 17, 2022

(54) CONFIGURATION OR DATA CACHING FOR PROGRAMMABLE LOGIC DEVICE

(71) Applicant: Intel Corporation, Santa Clara, CA (US)

(72) Inventors: Scott J. Weber, Piedmont, CA (US); David Greenhill, Portola Valley, CA (US); Sean R. Atsatt, Santa Cruz, CA (US); Ravi Prakash Gutala, San Jose, CA (US); Aravind Raghavendra Dasu, Milpitas, CA (US); Jun Pin Tan, Kuala Lumpur (MY)

(73) Assignee: Intel Corporation, Santa Clara, CA (US)

( * ) Notice: Subject to any disclaimer, the term of this patent is extended or adjusted under 35 U.S.C. 154(b) by 862 days.

This patent is subject to a terminal disclaimer.

(21) Appl. No.: 15/868,627

(22) Filed: Jan. 11, 2018

(65) Prior Publication Data

US 2019/0042127 A1    Feb. 7, 2019

(51) Int. Cl.
*G06F 3/06* (2006.01)
*G06F 12/0802* (2016.01)
(Continued)

(52) U.S. Cl.
CPC .......... *G06F 3/0632* (2013.01); *G06F 3/0613* (2013.01); *G06F 3/0673* (2013.01);
(Continued)

(58) Field of Classification Search
CPC .. G06F 30/34; G06F 12/0802; G06F 12/0873; G06F 12/0875; G06F 2212/1021;
(Continued)

(56) References Cited

U.S. PATENT DOCUMENTS 6,091,263 A * 7/2000 New ................ H03K 19/17752
326/39
8,296,578 B1 * 10/2012 New ....................... G06F 30/39
713/189

(Continued)

OTHER PUBLICATIONS

Extended European Search Report for EP Application No. 18211450.4 dated May 28, 2019.

*Primary Examiner* — Zhuo H Li
(74) *Attorney, Agent, or Firm* — Fletcher Yoder P.C.

(57) ABSTRACT

An integrated circuit device may cache configuration data to enable rapid configuration from fabric cache memory. The integrated circuit device may include programmable logic fabric having configuration memory and programmable logic elements controlled by the configuration memory, and sector-aligned memory apart from the programmable logic fabric. A first sector of the configuration memory may be programmed with first configuration data. The sector-aligned memory may include a first sector of sector-aligned memory that may cache the first configuration data while the configuration memory is programmed with the first configuration data a first time. A second sector of sector-aligned memory may cache second configuration data for a second sector of the configuration memory in parallel while the first sector of sector-aligned memory caches the first configuration data for the first sector of the configuration memory.

19 Claims, 12 Drawing Sheets

(51) Int. Cl.
| | |
|---|---|
| *G06F 12/0873* | (2016.01) |
| *H03K 19/17736* | (2020.01) |
| *G11C 7/22* | (2006.01) |
| *G11C 5/02* | (2006.01) |
| *G06F 12/0875* | (2016.01) |
| *G06F 30/34* | (2020.01) |
| *G11C 5/04* | (2006.01) |
| *G11C 7/10* | (2006.01) |

(52) U.S. Cl.
CPC ...... *G06F 12/0802* (2013.01); *G06F 12/0873* (2013.01); *G06F 12/0875* (2013.01); *G06F 30/34* (2020.01); *G11C 5/025* (2013.01); *G11C 7/22* (2013.01); *H03K 19/17744* (2013.01); *G06F 2212/1021* (2013.01); *G06F 2212/284* (2013.01); *G06F 2212/45* (2013.01); *G06F 2212/452* (2013.01); *G11C 5/04* (2013.01); *G11C 7/1039* (2013.01); *G11C 2207/2245* (2013.01)

(58) Field of Classification Search
CPC ........... G06F 2212/284; G06F 2212/45; G06F 2212/452; G06F 3/0613; G06F 3/0632; G06F 3/0673; G11C 2207/2245; G11C 5/025; G11C 5/04; G11C 7/1039; G11C 7/22; H03K 19/17744; Y02D 10/00
See application file for complete search history.

(56) References Cited

U.S. PATENT DOCUMENTS 9,432,298 B1* 8/2016 Smith ................. H04L 49/9057
2017/0017576 A1* 1/2017 Cammarota ............ G06N 5/04

* cited by examiner

CONFIGURATION OR DATA CACHING FOR PROGRAMMABLE LOGIC DEVICE

BACKGROUND

This disclosure relates to caching a configuration program or data for rapid programming onto a programmable logic device.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Programmable logic devices are a class of integrated circuits that can be programmed to perform a wide variety of operations. A programmable logic device may include programmable logic elements programmed by a form of memory known as configuration random access memory (CRAM). Thus, to program a circuit design into a programmable logic device, the circuit design may be compiled into a bitstream and programmed into CRAM cells. The values programmed into the CRAM cells define the operation of programmable logic elements of the programmable logic device.

The highly flexible nature of programmable logic devices makes them an excellent fit for accelerating many computing tasks. Thus, programmable logic devices are increasingly used as accelerators for machine learning, video processing, voice recognition, image recognition, and many other highly specialized tasks, particularly those that would be too slow or inefficient in software running on a processor. Moreover, bitstreams that define a particular accelerator function may be programmed into a programmable logic device as requested, in a process known as partial reconfiguration. Even this, however, takes some amount of time to perform. Although partial reconfiguration may take place very quickly, on the order of milliseconds, some tasks may call for even quicker calculations, on the order of microseconds or faster.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
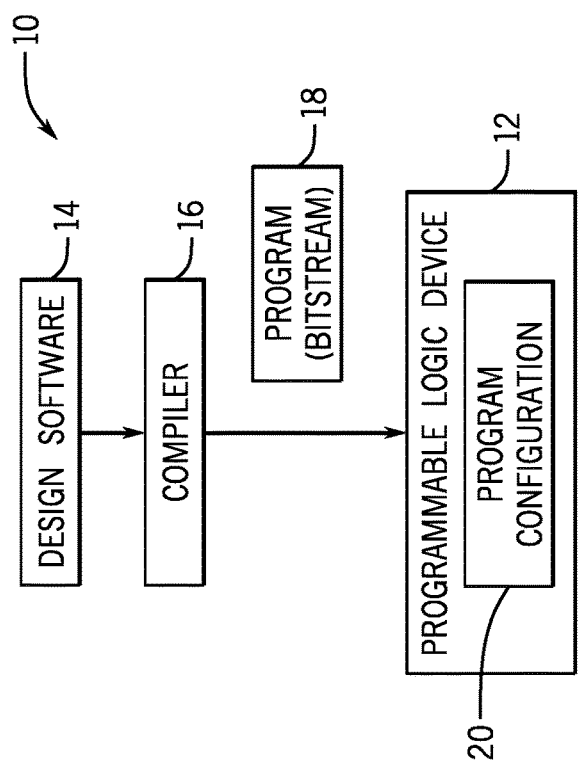
FIG. 1 is a block diagram of a programmable logic device that is programmed with a circuit design, in accordance with an embodiment.

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase A "or" B is intended to mean A, B, or both A and B.

The highly flexible nature of programmable logic devices makes them an excellent fit for accelerating many computing tasks. Thus, programmable logic devices are increasingly used as accelerators for machine learning, video processing, voice recognition, image recognition, and many other highly specialized tasks, particularly those that would be too slow or inefficient in software running on a processor. Moreover, bitstreams that define a particular accelerator function may be programmed into a programmable logic device as requested, in a process known as partial reconfiguration. To increase the speed at which configuration, including partial reconfiguration, can occur on a programmable logic device, as well as to better control power consumption, reduce manufacturing costs, among other things, this disclosure describes systems and methods that employ a programmable logic device that may be rapidly configured using a configuration program that is cached in a local memory that is locally accessible to the programmable logic device fabric. The local memory may be able to cache a program (e.g., bitstream, data and/or configuration) for rapid programming, and thus may be referred to as "fabric cache memory." In some cases, the fabric cache memory may be associated with a particular sector of programmable logic fabric, and thus may be described as "sector-aligned memory."

In some cases, the programmable logic device may be composed of at least two separate die. The programmable logic device may include a first die that contains primarily programmable logic fabric, and a second die that contains fabric support circuitry to support the operation of the programmable logic fabric. For example, the second die may contain at least some fabric support circuitry that may operate the programmable logic fabric (e.g., the fabric support circuitry of the second die may be essential to the operation of the programmable logic fabric of the first die). Thus, the fabric support circuitry may include, among other things, a device controller (sometimes referred to as a secure device manager (SDM)), a sector controller (sometimes referred to as a local sector manager (LSM)), a network-on-chip (NOC), a configuration network on chip (CNOC), data routing circuitry, local (e.g., sectorized or sector-aligned) memory used to store and/or cache configuration programs (bitstreams) or data, memory controllers used to program the programmable logic fabric, input/output (I/O) interfaces or modules for the programmable logic fabric, external memory interfaces (e.g., for a high bandwidth memory (HBM) device), an embedded processor (e.g., an embedded Intel® Xeon® processor by Intel Corporation of Santa Clara, Calif.) or an interface to connect to a processor (e.g., an interface to an Intel® Xeon® processor by Intel Corporation of Santa Clara, Calif.), voltage control circuitry, thermal monitoring circuitry, decoupling capacitors, power clamps, or electrostatic discharge circuitry, to name just a few circuit elements that may be present on the second die. Indeed, in some embodiments, the first die may entirely or almost entirely contain programmable logic fabric, and the second die may contain all or almost all of the fabric support circuitry that controls the programmable logic fabric.

The fabric support circuitry may include the local memory used to cache a configuration program (e.g., bitstream). This cached configuration program may be used to rapidly configure the programmable logic device, since the physical distance (and/or the number of transactions) that may transpire between the local memory and the programmable logic fabric may be much less than the physical distance (and/or the number of transactions) that may transpire between an external memory and the programmable logic device. The local memory may also be sectorized and associated with a corresponding sector of the programmable logic fabric. This may allow the local memory to be secured from access by other sectors of the programmable logic device. Furthermore, depending on the physical arrangement of the first die that contains the programmable logic fabric and the second die that contains the fabric support circuitry (e.g., the local memory), the local memory may be pipelined into the configuration memory (e.g., configuration random access memory (CRAM) or nonvolatile configuration memory) of the programmable logic fabric, allowing for even faster configuration.

With this in mind, FIG. 1 illustrates a block diagram of a system 10 that may employ a reconfigurable programmable logic device 12 that can cache a configuration program in local memory for rapid configuration or reconfiguration. Using the system 10, a designer may implement a circuit design functionality on an integrated circuit, such as a reconfigurable programmable logic device 12, such as a field programmable gate array (FPGA). The designer may implement a circuit design to be programmed onto the programmable logic device 12 using design software 14, such as a version of Intel® Quartus® by Intel Corporation of Santa Clara, Calif. The design software 14 may use a compiler 16 to generate a low-level circuit-design defined by configuration data (bitstream) 18, sometimes known as a program object file and/or configuration program, that programs the programmable logic device 12. Thus, the compiler 16 may provide machine-readable instructions representative of the circuit design to the programmable logic device 12. For example, the programmable logic device 12 may receive one or more configuration programs (bitstreams) 18 that describe the hardware implementations that should be stored in the programmable logic device 12. A configuration program (e.g., bitstream) 18 may be programmed into the programmable logic device 12 as a configuration program 20. The configuration program 20 may, in some cases, represent an accelerator function to perform for machine learning, video processing, voice recognition, image recognition, or other highly specialized task.

To carry out the systems and methods of this disclosure, the programmable logic device 12 may take any suitable form that includes a local memory having sufficient capacity and bandwidth to rapidly reprogram the programmable logic fabric (e.g., to rapidly reprogram the configurable random-access memory of the programmable logic fabric with a different configuration program (e.g., bitstream)). In some cases, the areas of the programmable logic fabric may be programmed in parallel by sector, from local memory associated with that sector, which is referred to in this disclosure as "sector-aligned memory." Sector-aligned memory may be incorporated into the programmable logic device on an integrated circuit die that is separate from, but nearby, the integrated circuit die that holds the sector programmable logic fabric, as will be described further below. The sector-aligned memory may also be incorporated into an integrated circuit die containing the programmable logic fabric if the sector-aligned memory has the capacity to store all or part of a configuration data (bitstream) for programming that sector of programmable logic fabric.

Figure 2:
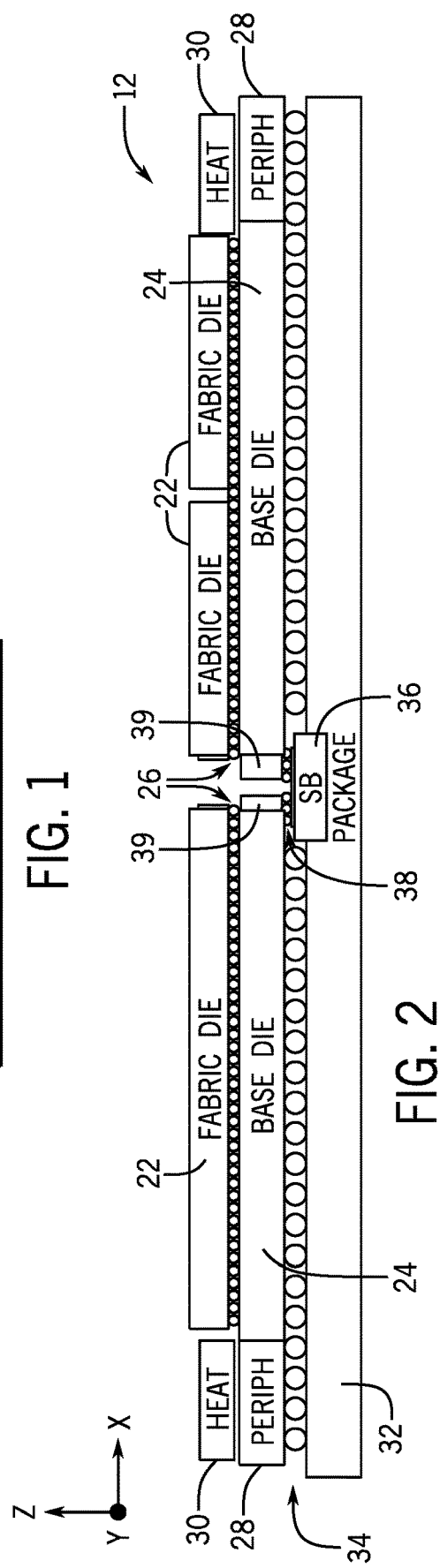
FIG. 2 is a block diagram of a package including the programmable logic device where a fabric die is vertically stacked with a base die, in accordance with an embodiment.

Thus, the programmable logic device 12 may have two separate integrated circuit die where at least some of the programmable logic fabric is separated from at least some of the fabric support circuitry that operates the programmable logic fabric, which may include local memory, such as fabric cache memory and/or sector-aligned memory. One example of the programmable logic device 12 is shown in FIG. 2, but any suitable programmable logic device having local memory of sufficient bandwidth and capacity to serve as a fabric cache memory may be used. In the example of FIG. 2, the programmable logic device 12 includes a fabric die 22 and a base die 24 that are connected to one another via microbumps 26. Although the fabric die 22 and base die 24 appear in a one-to-one relationship or a two-to-one relationship in FIG. 2, other relationships may be used. For example, a single base die 24 may attach to several fabric die 22, or several base die 24 may attach to a single fabric die 22, or several base die 24 may attach to several fabric die 22 (e.g., in an interleaved pattern along the x- and/or y-direction). Peripheral circuitry 28 may be attached to, embedded within, and/or disposed on top of the base die 24, and heat spreaders 30 may be used to reduce an accumulation of heat on the programmable logic device 12. The heat spreaders 30 may appear above, as pictured, and/or below the package (e.g., as a double-sided heat sink). The base die 24 may attach to a package substrate 32 via C4 bumps 34. In the example of FIG. 2, two pairs of fabric die 22 and base die 24 are shown communicatively connected to one another via a silicon bridge 36 (e.g., an embedded multi-die interconnect bridge (EMIB)) and microbumps 38 at a silicon bridge interface 39.

Figure 3:
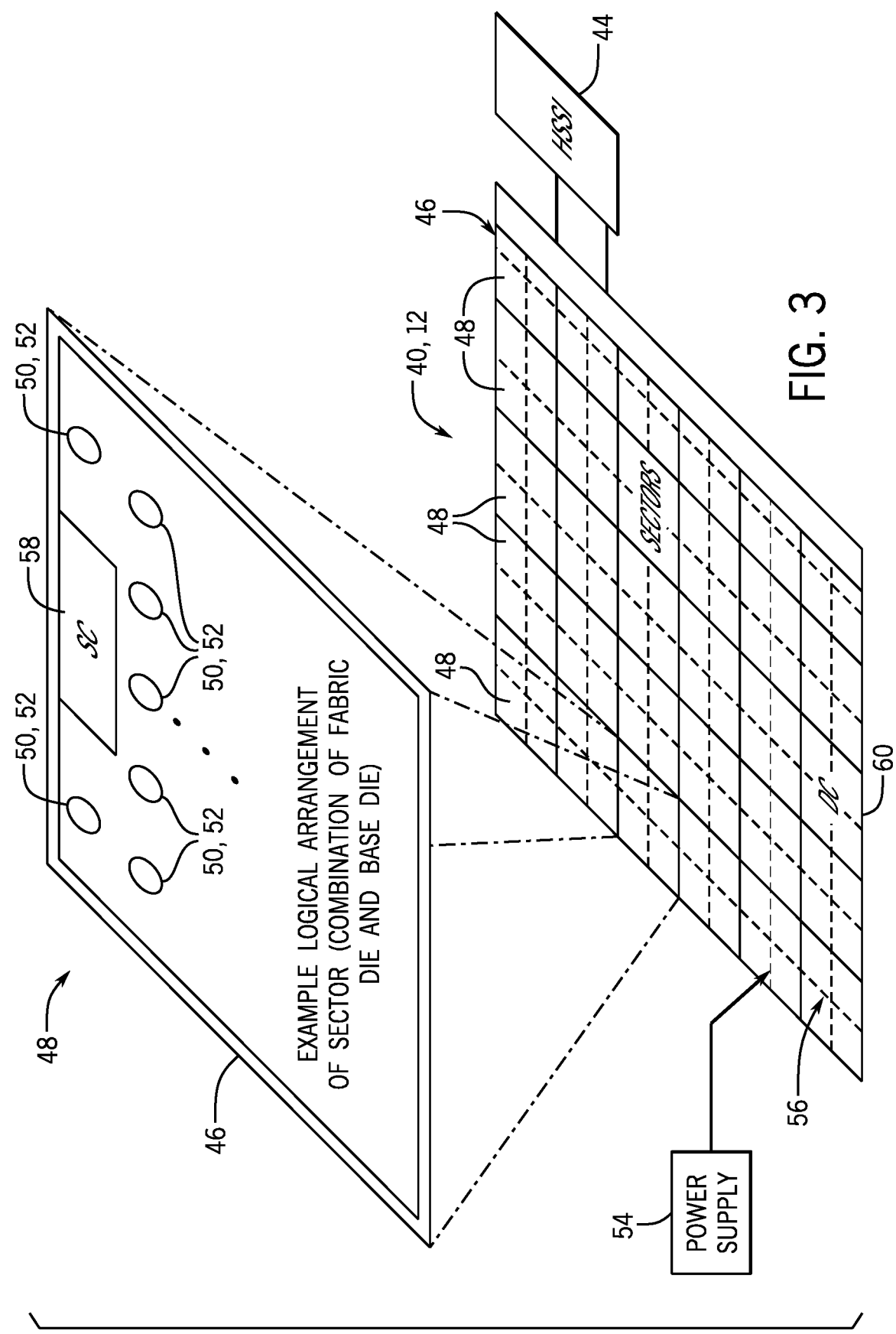
FIG. 3 is a block diagram of an example logical arrangement of the programmable logic device, in accordance with an embodiment.

In combination, the fabric die 22 and base die 24 may operate as a programmable logic device such as a field programmable gate array (FPGA). For example, the fabric die 22 and the base die 24 may operate in combination as an FPGA 40, shown in FIG. 3. It should be understood that the FPGA 40 shown in FIG. 3 is meant to represent the type of circuitry and/or a logical arrangement of a programmable logic device when the both the fabric die 22 and the base die 24 operate in combination. In other words, some of the circuitry of the FPGA 40 shown in FIG. 3 may be found in the fabric die 22 and some of the circuitry of the FPGA 40 shown in FIG. 3 may be found in the base die 24. Moreover, for the purposes of this example, the FPGA 40 is referred to as an FPGA, though it should be understood that the device may be any suitable type of programmable logic device (e.g., an application-specific integrated circuit and/or application-specific standard product).

In the example of FIG. 3, the FPGA 40 may include transceiver circuitry (HSSI) 44 for driving signals off of the FPGA 40 and for receiving signals from other devices. The transceiver circuitry (HSSI) may be part of the fabric die 22, the base die 24, or a separate die altogether. Interconnection resources 46 may be used to route signals, such as clock or data signals, through the FPGA 40. The FPGA 40 of FIG. 3 is shown to be sectorized, meaning that programmable logic resources may be distributed through a number of discrete programmable logic sectors 48. Each programmable logic sector 48 may include a number of programmable logic elements 50 having operations defined by configuration memory 52 (e.g., configuration random access memory (CRAM)). The programmable logic elements 50 may include combinational or sequential logic circuitry. For example, the programmable logic elements 50 may include look-up tables, registers, multiplexers, routing wires, and so forth. A designer may program the programmable logic elements 50 to perform a variety of desired functions. A power supply 54 may provide a source of voltage and current to a power distribution network (PDN) 56 that distributes electrical power to the various components of the FPGA 40. Operating the circuitry of the FPGA 40 causes power to be drawn from the power distribution network 56.

There may be any suitable number of programmable logic sectors 48 on the FPGA 40. Indeed, while 29 programmable logic sectors 48 are shown here, it should be appreciated that more or fewer may appear in an actual implementation (e.g., in some cases, on the order of 50, 100, or 1000 sectors or more). Each programmable logic sector 48 may include a sector controller (SC) 58 that controls the operation of the programmable logic sector 48. Each sector controller 58 may be in communication with a device controller (DC) 60. Each sector controller 58 may accept commands and data from the device controller 60, and may read data from and write data into its configuration memory 52 based on control signals from the device controller 60. In addition to these operations, the sector controller 58 and/or device controller 60 may be augmented with numerous additional capabilities. Such capabilities may include coordinating memory transactions between local in-fabric memory (e.g., local fabric memory or CRAM being used for data storage) and sector-aligned memory associated with that particular programmable logic sector 48, decrypting configuration data (bitstreams) 18, and locally sequencing reads and writes to implement error detection and correction on the configuration memory 52 and sequencing test control signals to effect various test modes.

The sector controllers 58 and the device controller 60 may be implemented as state machines and/or processors. For example, each operation of the sector controllers 58 or the device controller 60 may be implemented as a separate routine in a memory containing a control program. This control program memory may be fixed in a read-only memory (ROM) or stored in a writable memory, such as random-access memory (RAM). The ROM may have a size larger than would be used to store only one copy of each routine. This may allow each routine to have multiple variants depending on "modes" the local controller may be placed into. When the control program memory is implemented as random access memory (RAM), the RAM may be written with new routines to implement new operations and functionality into the programmable logic sectors 48. This may provide usable extensibility in an efficient and easily understood way. This may be useful because new commands could bring about large amounts of local activity within the sector at the expense of only a small amount of communication between the device controller 60 and the sector controllers 58.

Each sector controller 58 thus may communicate with the device controller 60, which may coordinate the operations of the sector controllers 58 and convey commands initiated from outside the FPGA device 40. To support this communication, the interconnection resources 46 may act as a network between the device controller 60 and each sector controller 58. The interconnection resources may support a wide variety of signals between the device controller 60 and each sector controller 58. In one example, these signals may be transmitted as communication packets.

The FPGA 40 may be electrically programmed. With electrical programming arrangements, the programmable elements 50 may include one or more logic elements (wires, gates, registers, etc.). For example, during programming, configuration data is loaded into the configuration memory 52 using pins 44 and input/output circuitry 42. In one example, the configuration memory 52 may be implemented as configuration random-access-memory (CRAM) cells. The use of configuration memory 52 based on RAM technology is described herein is intended to be only one example. Moreover, configuration memory 52 may be distributed (e.g., as RAM cells) throughout the various programmable logic sectors 48 the FPGA 40. The configuration memory 52 may provide a corresponding static control output signal that controls the state of an associated programmable logic element 50 or programmable component of the interconnection resources 46. The output signals of the configuration memory 52 may configure the may be applied to the gates of metal-oxide-semiconductor (MOS) transistors that control the states of the programmable logic elements 50 or programmable components of the interconnection resources 46.

As stated above, the logical arrangement of the FPGA 40 shown in FIG. 3 may result from a combination of the fabric die 22 and base die 24. The circuitry of the fabric die 22 and base die 24 may be divided in any suitable manner. In one example, shown in block diagram form in FIG. 4, the fabric die 22 contains primarily programmable logic fabric resources, such as the programmable logic elements 50 and configuration memory 52. In some cases, this may also entail certain fabric control circuitry such as the sector controller (SC) 58 or device controller (DC) 60. The base die 24 may include supporting circuitry to operate the programmable logic elements 50 and configuration memory 52. Shown here, the base die 24 includes sector 1 support circuitry 70A and sector 2 support circuitry 70B to support two corresponding sectors of the programmable logic elements 50 and configuration memory 52 of the fabric die 22. The base die 24 may also include support circuitry for other sectors of the fabric die 22.

Thus, while the fabric die 22 may include primarily programmable logic fabric resources, such as the programmable logic elements 50 and configuration memory 52, the base die 24 may include, among other things, a device controller (DC) 60, a sector controller (SC) 58, a network-on-chip (NOC), a configuration network on chip (CNOC), data routing circuitry, sector-aligned memory used to store and/or cache configuration programs (bitstreams) or data, memory controllers used to program the programmable logic fabric, input/output (I/O) interfaces or modules for the programmable logic fabric, external memory interfaces (e.g., for a high bandwidth memory (HBM) device), an embedded processor (e.g., an embedded Intel® Xeon® processor by Intel Corporation of Santa Clara, Calif.) or an interface to connect to a processor (e.g., an interface to an Intel® Xeon® processor by Intel Corporation of Santa Clara, Calif.), voltage control circuitry, thermal monitoring circuitry, decoupling capacitors, power clamps, and/or electrostatic discharge (ESD) circuitry, to name just a few elements that may be present on the base die 24. It should be understood that some of these elements that may be part of the fabric support circuitry of the base die 24 may additionally or alternatively be a part of the fabric die 22. For example, the device controller (DC) 60 and/or the sector controllers (SC) 58 may be part of the fabric die 22.

Figure 4:
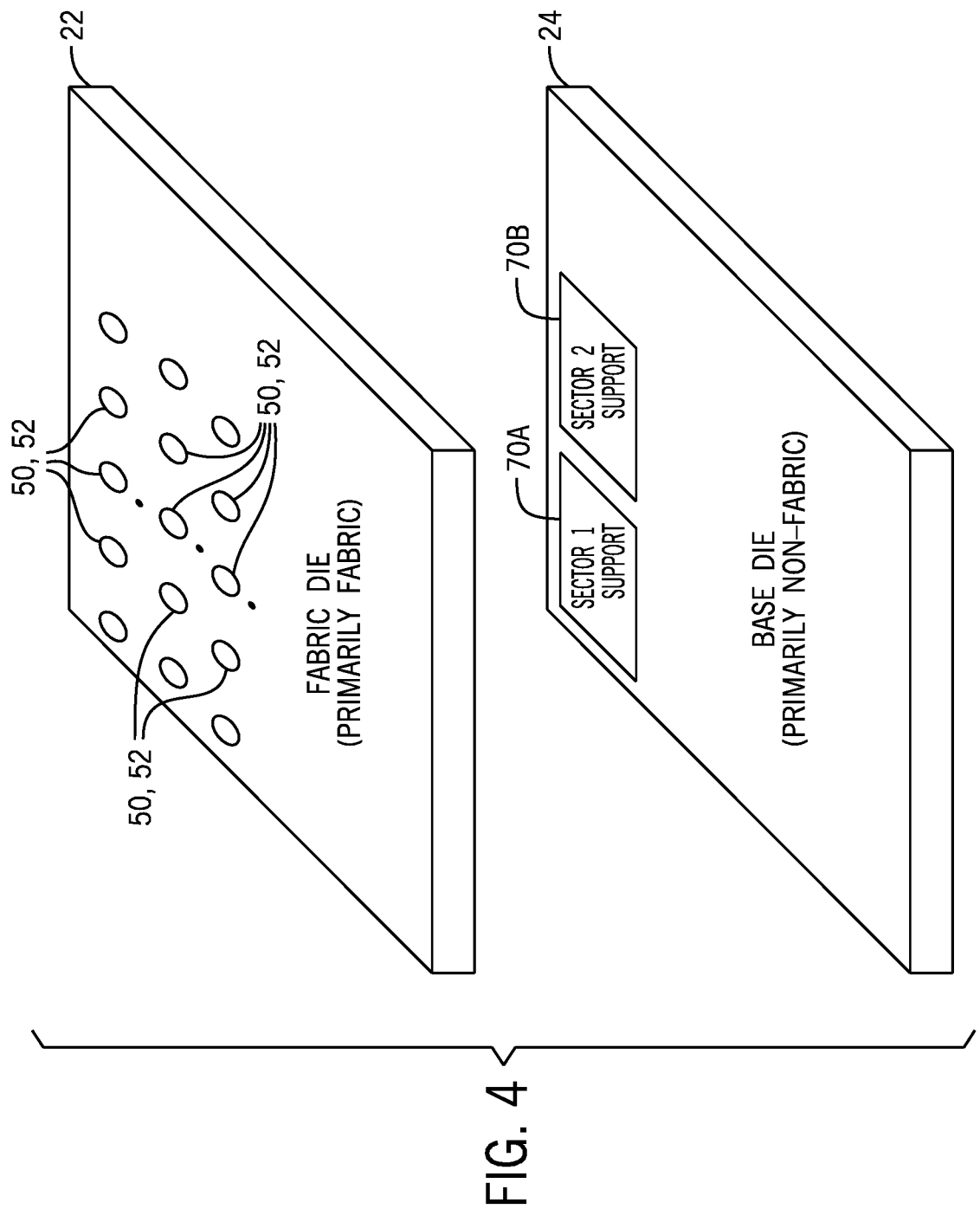
FIG. 4 is a block diagram showing a fabric die of the programmable logic device that contains programmable logic fabric and a base die of the programmable logic device that contains primarily non-fabric circuitry that operates the programmable logic fabric, in accordance with an embodiment.

While FIG. 4 represents an example where the fabric die 22 contains primarily programmable logic fabric, with most other components located in the base die 24, the fabric die 22 may contain some of the other components to support the programmable logic fabric. Thus, in some embodiments, the fabric die 22 may include one or more of a device controller (DC) 60, a sector controller (SC) 58, a network-on-chip (NOC), a configuration network on chip (CNOC), data routing circuitry, sector-aligned memory used to store and/or cache configuration programs (bitstreams) or data, memory controllers used to program the programmable logic fabric, input/output (I/O) interfaces or modules for the programmable logic fabric, external memory interfaces (e.g., for a high bandwidth memory (HBM) device), an embedded processor (e.g., an embedded Intel® Xeon® processor by Intel Corporation of Santa Clara, Calif.) or an interface to connect to a processor (e.g., an interface to an Intel® Xeon® processor by Intel Corporation of Santa Clara, Calif.), voltage control circuitry, thermal monitoring circuitry, decoupling capacitors, power clamps, and/or electrostatic discharge (ESD) circuitry, and other elements may be disposed on the base die 24.

Figure 5:
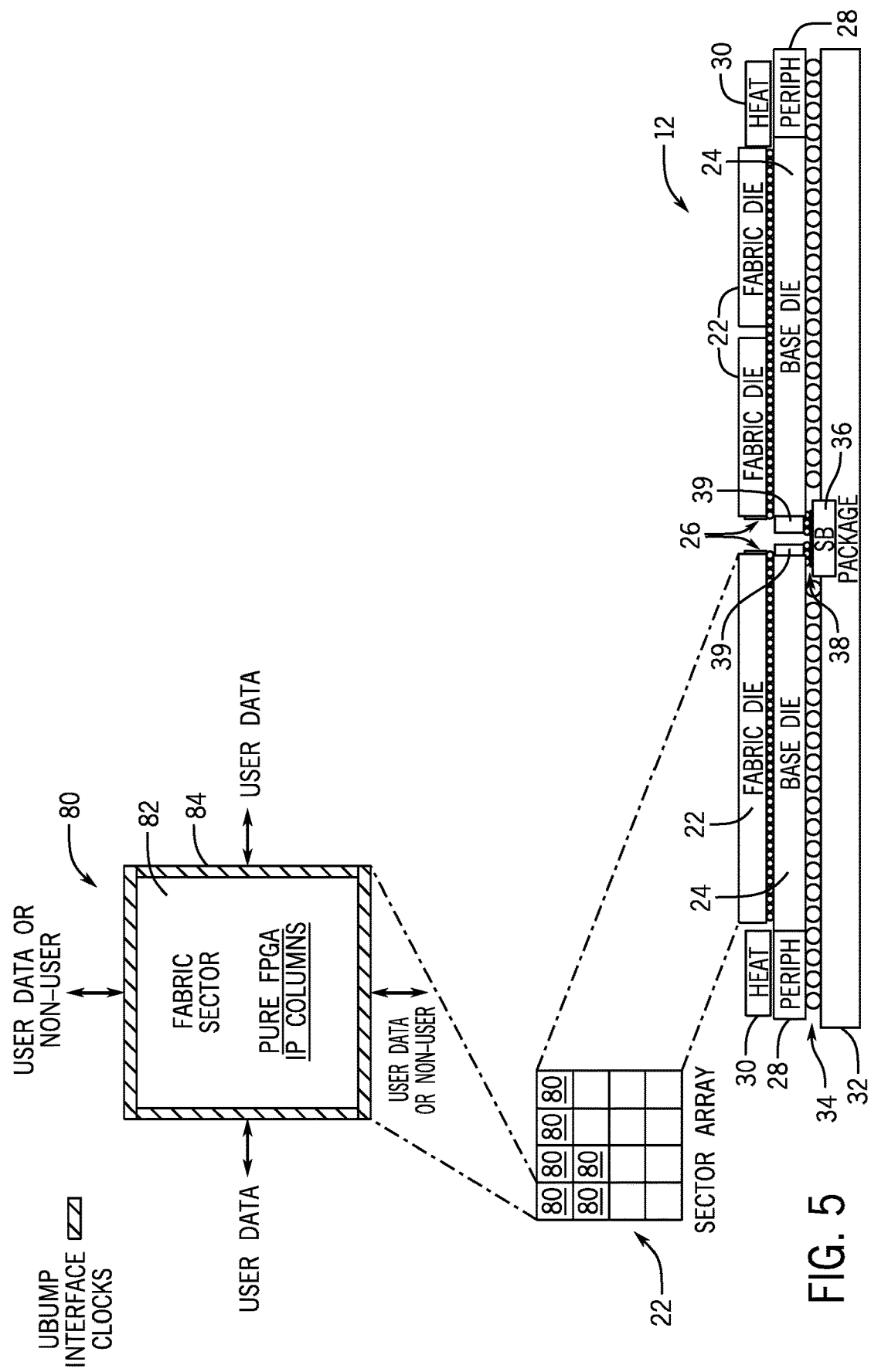
FIG. 5 is a block diagram of an example topology of the fabric die, in accordance with an embodiment.
Figure 6:
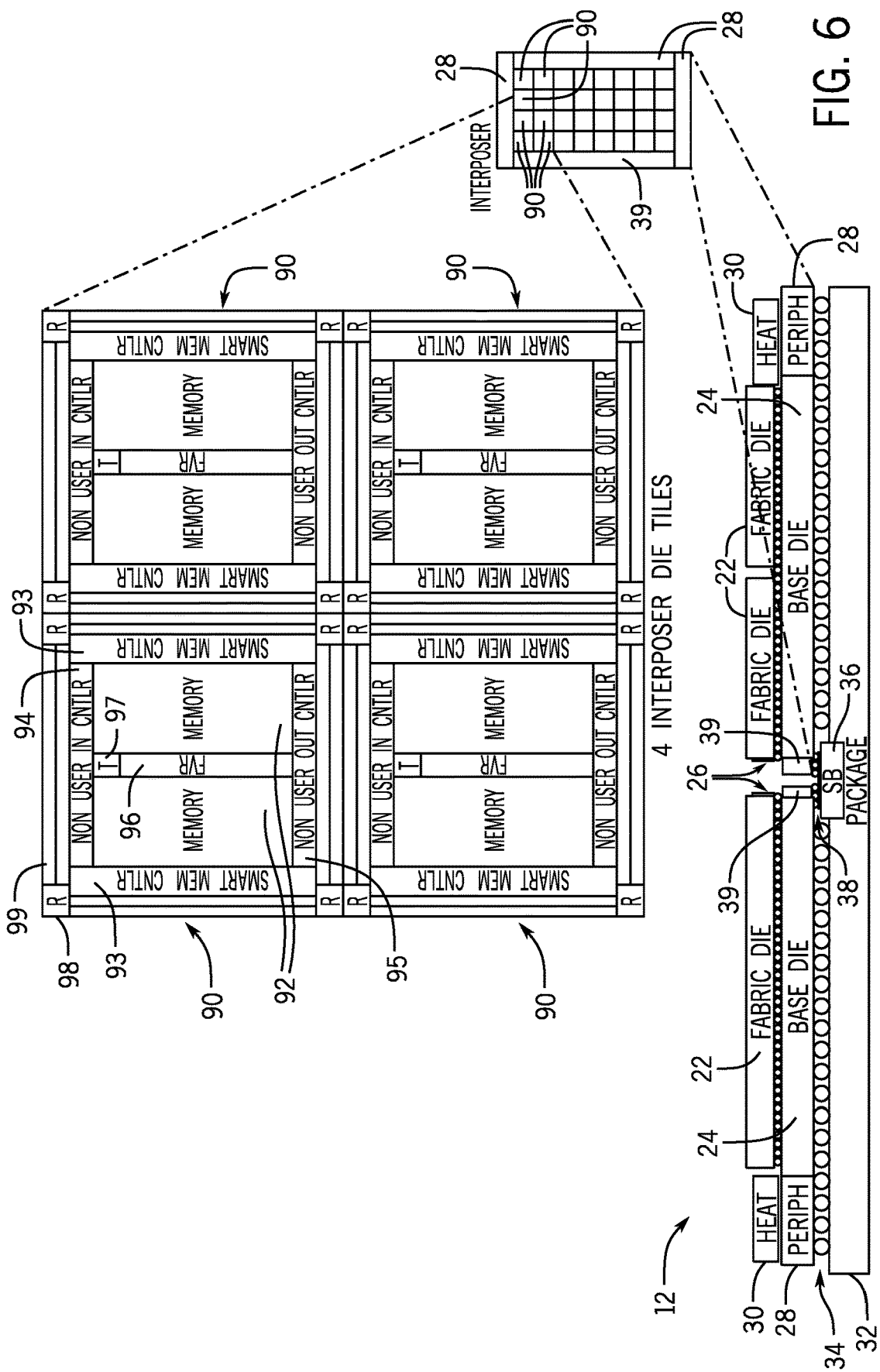
FIG. 6 is a block diagram of an example topology of the base die, in accordance with an embodiment.

One example physical arrangement of the fabric die 22 and the base die 24 is shown by FIGS. 5 and 6. In FIG. 5, the fabric die 22 is shown to contain an array of fabric sectors 80 that include fabric resources 82 (e.g., programmable elements programmed by CRAM and/or certain fabric control circuitry such as the sector controller (SC) 58 or device controller (DC) 60) and interface circuitry 84. The interface circuitry 84 may include data routing and/or clocking resources, or may include an interface to data routing and/or clocking resources on the base die 24. Thus, the interface circuitry 84 may connect with a micro-bump (ubump) interface to connect to the base die 24.

FIG. 6 provides a complementary arrangement of the base die 24. The base die 24 may represent an active interposer with several sectors 90 surrounded by peripheral circuitry 28 and the silicon bridge interface 39. Each sector 90 may include a variety of fabric support circuitry, such as sector-aligned memory 92, memory control circuitry 93, non-user input control circuitry 94, non-user output control circuitry 95, a voltage regulator such as a fully integrated voltage regulator (FIVR) 96, one or more thermal sensors 97, data and configuration routers 98, and/or data or configuration pathways 99. The memory control circuitry 93 may be used to program the sector-aligned memory 92, the CRAM of the fabric die 22, or both. The non-user input control circuitry 94 and non-user output control circuitry 95 may allow the circuitry of the sectors 90 to exchange data and/or control signals (e.g., via configurable data routing network-on-chip (NOC) or a configuration network on chip (CNOC)). In one example, the non-user input control circuitry 94 and non-user output control circuitry 95 may operate as the sector controller (SC) 58 for a corresponding fabric sector 80 (as shown in FIG. 5). The FIVR 96 and the one or more thermal sensors 97 may be used to provide a desired voltage to the corresponding fabric sector 80 (as shown in FIG. 5), enabling the voltage to be selectively scaled up or down, or removed, depending on power and thermal specifications (e.g., based at least in part on temperature as measured by a thermal sensor 97 and/or in accordance with a dynamic voltage and frequency scaling (DVFS) scheme). Even though the thermal sensors 97 are in a separate die from that of the programmable logic fabric elements, when the base die 24 is directly adjacent to the fabric die 22 as in this example, the temperature measured by the thermal sensor 97 in the base die 24 may correspond well enough to the fabric die 22 to allow for temperature-based operations (e.g., turn off power to the corresponding fabric sector 80 to prevent a permanent-denial-of-service (PDOS) condition).

Figure 7:
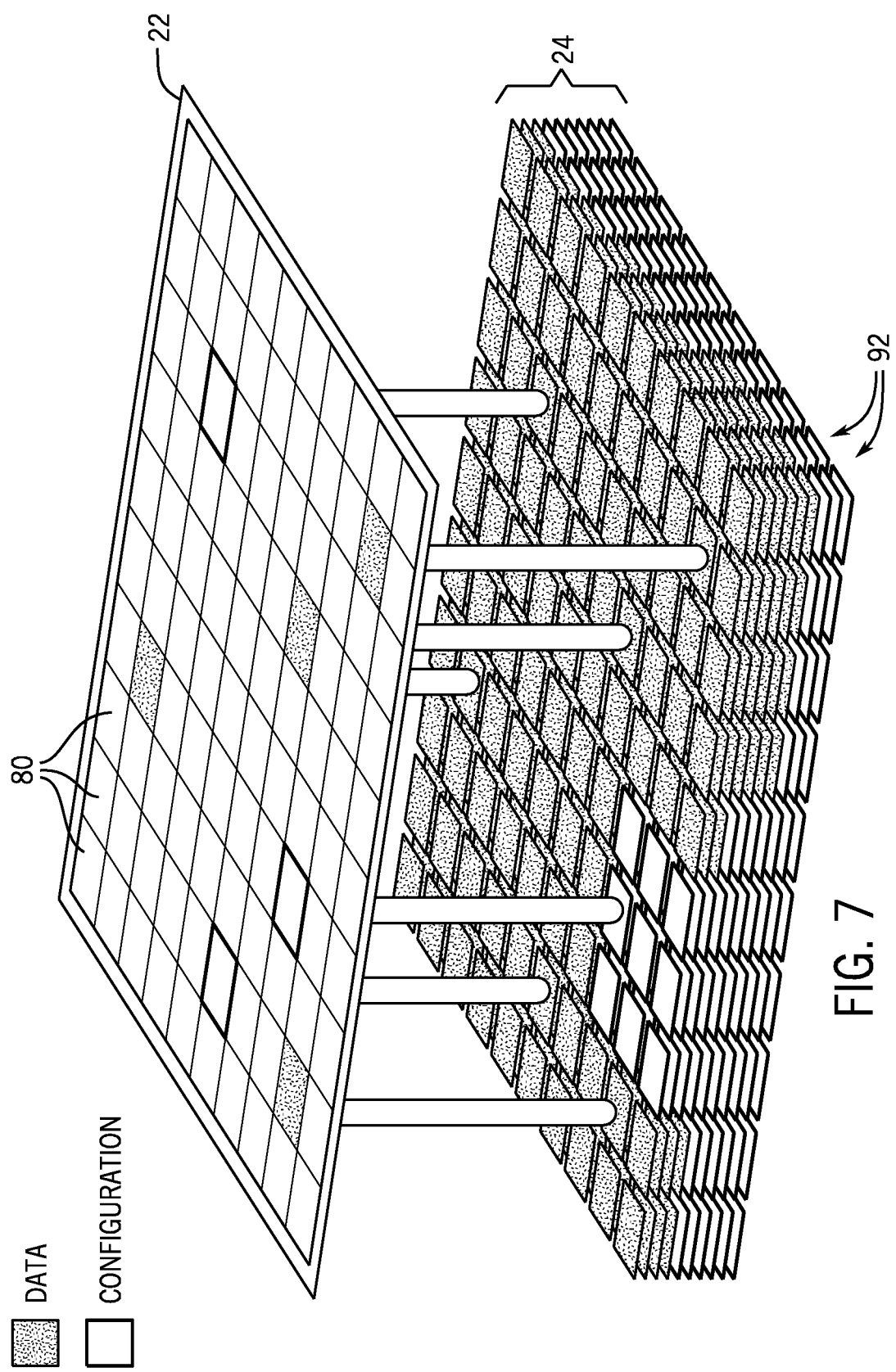
FIG. 7 is a schematic block diagram of sector-aligned memory of the base die that may support rapid configuration and/or caching for corresponding sectors of the fabric die, in accordance with an embodiment.

By vertically aligning the fabric die 22 and the base die 24, memory located in the base die 24 may be accessible in parallel to fabric sectors 80 of the fabric die 22. FIG. 7 shows an example in which sector-aligned memory 92 may be contained in the base die 24. The sector-aligned memory 92 may be accessible to respective fabric sectors 80 of the fabric die 22, and may contain user data (generated by or accessible by a circuit design programmed into the programmable logic fabric of the base die 24) or configuration data that may be used to program the programmable logic fabric of the base die 24. In the example of FIG. 7, the fabric sectors 80 may access specific regions of sector-aligned memory 92. For example, there may be N regions of sector-aligned memory 92 that can be accessible by N corresponding fabric sectors 80 at the same time (e.g., in parallel). In some cases, the sector-aligned memory 92 may be accessible to more than one fabric sector 80 or multiple sectors of sector-aligned memory 92 may be accessible to a single fabric sector 80. The sector-aligned memory 92 is shown in FIG. 7 as vertically stacked memory. This may allow a large amount of memory to be located within the base die 24. However, the sector-aligned memory 92 may occupy a single plane of the base die 24 in some embodiments.

Regardless of its exact placement, the sector-aligned memory 92 may be located near enough to a particular area of the programmable logic fabric of the programmable logic device 12 to be able to provide very rapid data transfers. This may enable the sector-aligned memory 92 to be used for caching of data and/or configuration programs that may be programmed into the programmable logic fabric. One example of circuitry that may use the sector-aligned memory 92 appears in FIG. 8. The various components shown in FIG. 8 may be located in a single die or may be distributed through several die (e.g., distributed through the fabric die 22 or the base die 24). Indeed, when programmable logic device 12 includes the fabric die 22 and the base die 24, each element of circuitry represented by the block diagram of FIG. 8 may be found in at least one of the fabric die 22 and the base die 24, as desired. In many situations, however, the sector-aligned memory 92 may have a sufficiently high capacity that it may not fit in the fabric die 22, and thus may be located in the base die 24.

Figure 8:
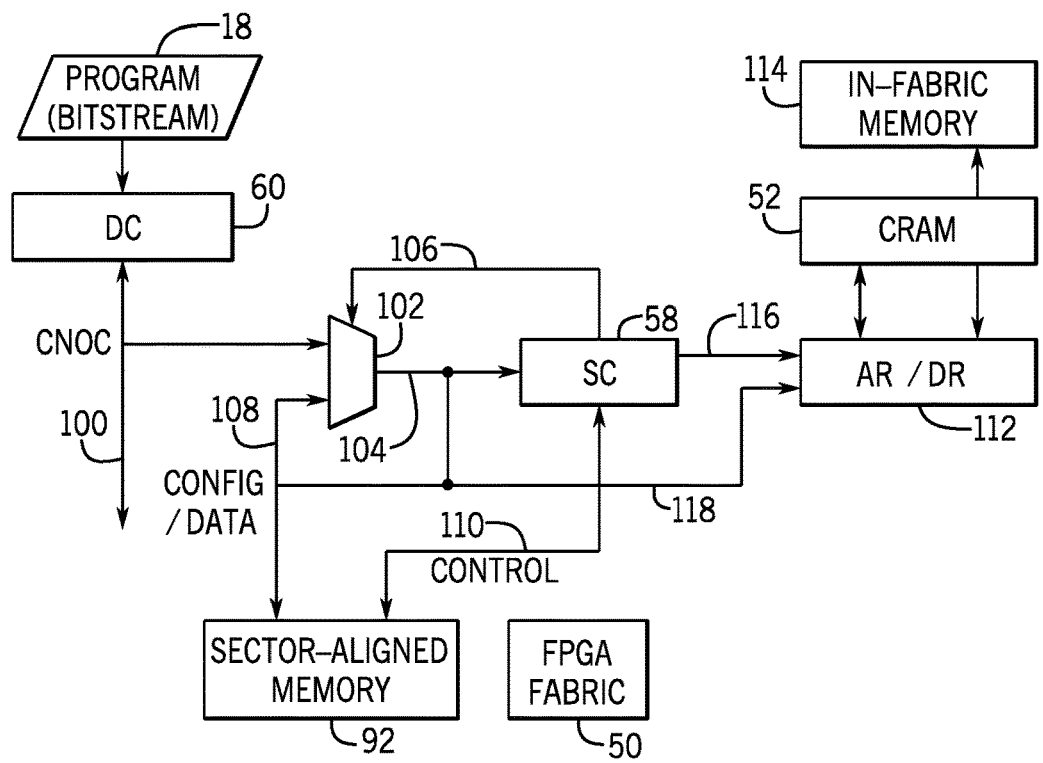
FIG. 8 is a block diagram of circuitry to interface a local memory and programmable logic fabric to enable rapid configuration and/or caching using a sector controller, in accordance with an embodiment.

The circuitry shown in FIG. 8 includes the device controller (DC) 60 that may receive, among other things, a configuration data (bitstream) 18. The configuration data (bitstream) 18 may represent configuration data that may program the configuration memory (CRAM) 52 of a particular sector of programmable logic elements (FPGA fabric) 50. The device controller 60 may receive the configuration data (bitstream) 18 from an external data source (e.g., an external data storage device or external memory device) and may direct the configuration data (bitstream) 18 to the sector controller (SC) 58 of the particular sector via a configuration network on chip (CNOC) 100 or any other suitable pathway.

Routing circuitry 102 (e.g., a multiplexer) may provide the configuration data (bitstream) 18 to the sector controller (SC) 58 via a main signal path 104. The configuration data (bitstream) 18 may inform the sector controller (SC) 58 whether to receive additional data of the configuration data (bitstream) 18 from the CNOC 100 or to get it from the sector-aligned memory 92, and/or whether to cache or pre-cache (e.g., in a cache prefetch) the configuration data (bitstream) 18 into the sector-aligned memory 92. In one example, the configuration data (bitstream) 18 may contain a command, which may be encrypted, to instruct the sector controller (SC) 58 whether to receive additional data of the configuration data (bitstream) 18 from the CNOC 100 or to get it from the sector-aligned memory 92. In another example, a portion of the configuration data (bitstream) 18 may have an identifying sequence (e.g., a unique sequence, a hash, an encrypted value, a unique preamble, an initial set of bits belonging to a particular configuration data (bitstream) 18) that uniquely identifies the configuration data (bitstream) 18. From the unique sequence, the sector controller (SC) 58 may identify that the same configuration data (bitstream) 18 was previously received and cached in the sector-aligned memory 92, and thus may get data of the configuration data (bitstream) 18 from the sector-aligned memory 92. The sector controller (SC) 58 may independently manage where to store or retrieve data in the sector-aligned memory 92 or may be instructed by the configuration data (bitstream) 18 where to store or retrieve data in the sector-aligned memory 92.

Thus, depending on the content of the configuration data (bitstream) 18, the sector controller (SC) 58 may issue a selection signal over a selection pathway 106 to control the routing circuitry 102. Depending on the selection signal on the selection pathway 106, the routing circuitry 102 may provide either data on the CNOC 100 or on a data pathway 108 from the sector-aligned memory 92 to the sector controller (SC) 58. A control pathway 110 may enable control communication between the sector controller (SC) 58 and the sector-aligned memory 92. Depending on the content of the configuration data (bitstream) 18, the sector controller (SC) 58 may issue a control signal over a control pathway 110 to cause the sector-aligned memory 92 to retrieve data from or store data into the sector-aligned memory 92.

A memory address register/data register (AR/DR) 112 may program the configuration memory (CRAM) 52 and/or in-fabric memory 114 based on instructions from the sector controller (SC) 58 on a control pathway 116 and using data received on a data pathway 118. In this way, the AR/DR 112 may rapidly program the CRAM 52 and/or in-fabric memory 114 with a configuration data (bitstream) 18 directly from sector-aligned memory 92 when so instructed, which may take place much more quickly than the time involved in receiving the entire configuration data (bitstream) 18 via the CNOC 100. In some cases, this may be 50% faster, twice as fast, 5× as fast, 10× as fast, 20× as fast, 50× as fast, 100× as fast, 200× as fast, 500× as fast, 1000× as fast, or faster, to program the CRAM 52 and/or in-fabric memory 114 with a configuration data (bitstream) 18 directly from sector-aligned memory 92 than to program the CRAM 52 and/or in-fabric memory 114 with the configuration data (bitstream) 18 from the CNOC 100. Here, it may also be noted that the amount of memory available in the in-fabric memory 114 may be much smaller than the amount of memory available in the sector-aligned memory 92. In fact, the sector-aligned memory 92 may have a capacity many times that of the in-fabric memory 114 (e.g., 10×, 100×, 1000×, or more).

Figure 9:
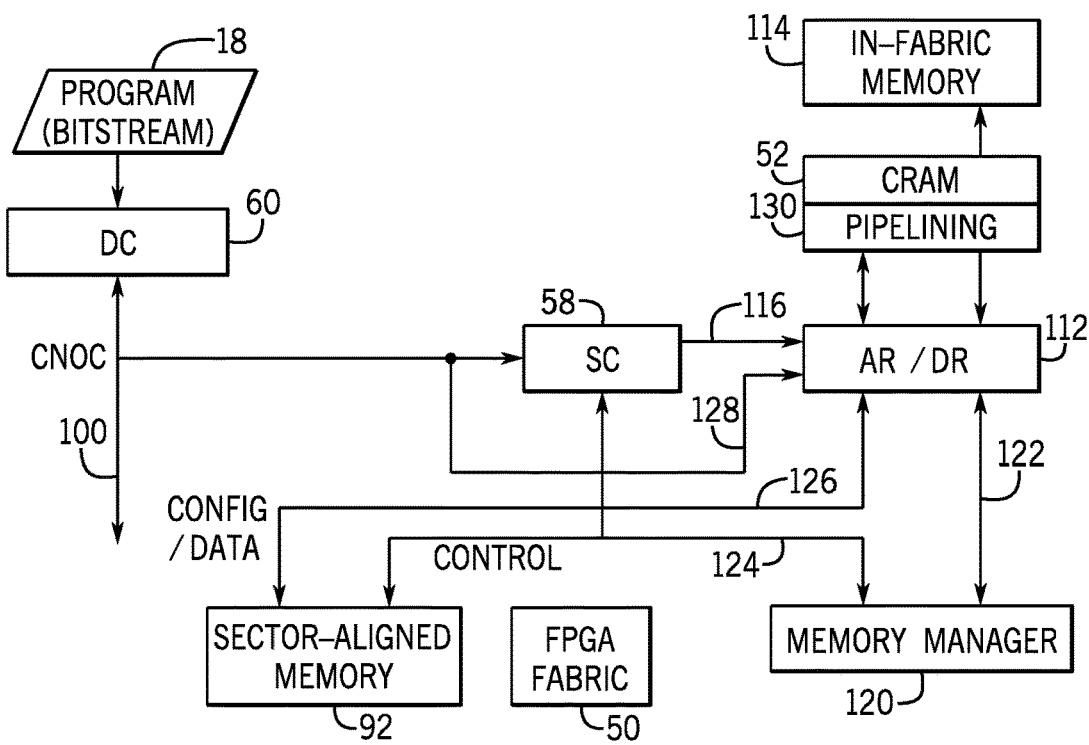
FIG. 9 is a block diagram of circuitry to interface a memory and programmable logic fabric to enable rapid configuration and/or caching using a sector controller and a memory manager for pipelining, in accordance with an embodiment.

For even faster programming, the programming of the CRAM 52 and/or in-fabric memory 114 may be pipelined, as shown in FIG. 9. A memory manager 120 may coordinate control of the AR/DR 112 via control pathways 122 and 124.

The memory manager 120 may be located in the fabric die 22 and/or in the base die 24. The memory manager 120 may be implemented as a state machine and/or as a processor running software or firmware, and may control the data transfers to and/or from the sector-aligned memory 92 and the AR/DR 112 over a data pathway 126. The data pathway 126 may communicate data more rapidly than may be provided over the CNOC 100. The data pathway 126 may have a faster frequency and/or may carry data more widely, in parallel, than the CNOC 100.

Depending on the content of the configuration data (bitstream) 18, the sector controller (SC) 58 may coordinate with the AR/DR 112 and the memory manager 120 to receive the configuration data (bitstream) 18 via a data pathway 128 from the CNOC 100 or from the sector-aligned memory 92. As mentioned above, the configuration data (bitstream) 18 may inform the sector controller (SC) 58 whether to receive additional data of the configuration data (bitstream) 18 from the CNOC 100 or to get it from the sector-aligned memory 92, and/or whether to cache or pre-cache (e.g., in a cache prefetch) the configuration data (bitstream) 18 into the sector-aligned memory 92. In one example, the configuration data (bitstream) 18 may contain a command, which may be encrypted, to instruct the sector controller (SC) 58 whether to receive additional data of the configuration data (bitstream) 18 from the CNOC 100 or to get it from the sector-aligned memory 92. In another example, a portion of the configuration data (bitstream) 18 may have an identifying sequence (e.g., a unique sequence, a hash, an encrypted value, a unique preamble, an initial set of bits belonging to a particular configuration data (bitstream) 18) that uniquely identifies the configuration data (bitstream) 18. From the unique sequence, the sector controller (SC) 58 may identify that the same configuration data (bitstream) 18 was previously received and cached in the sector-aligned memory 92, and thus may get data of the configuration data (bitstream) 18 from the sector-aligned memory 92. The sector controller (SC) 58 may independently manage where to store or retrieve data in the sector-aligned memory 92 or may be instructed by the configuration data (bitstream) 18 where to store or retrieve data in the sector-aligned memory 92.

The configuration data (bitstream) 18 and/or data from the CNOC 100 or the sector-aligned memory 92 may be loaded into the AR/DR 112 and pipelined into the CRAM 52 and/or in-fabric memory 114 via pipelining circuitry 130. The pipelining circuitry 130 may allow multiple cells of the configuration memory (CRAM) 52 to be programmed at once by pipelining multiple bits of data into registers of the AR/DR 112 before the AR/DR 112 programs multiple cells of the configuration memory (CRAM) 52 at once (e.g., instead of programming the configuration memory (CRAM) 52 one cell at a time). This may allow large quantities of data from the sector-aligned memory 92 to rapidly enter the CRAM 52 cells to quickly program the corresponding programmable logic elements 50. As noted above, this may take place much more quickly than the time involved in receiving the entire configuration data (bitstream) 18 via the CNOC 100. In some cases, this may be 50% faster, twice as fast, 5× as fast, 10× as fast, 20× as fast, 50× as fast, 100× as fast, 200× as fast, 500× as fast, 1000× as fast, or faster, to program the CRAM 52 and/or in-fabric memory 114 with a configuration data (bitstream) 18 directly from sector-aligned memory 92 than to program the CRAM 52 and/or in-fabric memory 114 with the configuration data (bitstream) 18 from the CNOC 100.

In any suitable configuration that includes sector-aligned memory 92, including but not limited to those shown in FIGS. 8 and 9, data and/or configuration programs (bitstreams) 18 may be cached in the sector-aligned memory 92 and used to rapidly program the configuration memory (CRAM) 52. Any suitable caching protocol may be used. In one example, shown by a flowchart 140 of FIG. 10, a configuration data (bitstream) 18 may be sent by the device controller (DC) 60 to a particular sector controller (SC) 58 associated with a particular fabric sector 80 (e.g., a particular sector of configuration memory 52 that controls a particular sector of programmable logic elements 50) to initiate configuration of that fabric sector 80 (block 142 of FIG. 10). The sector controller (SC) 58 may determine whether there is a cache hit (decision block 144 of FIG. 10). In this disclosure, "cache hit" means that the configuration data (bitstream) 18 indicates to the sector controller (SC) 58 that the sector controller (SC) 58 should program the configuration memory (CRAM) 52 and/or in-fabric memory 114 using data that is located in the sector-aligned memory 92 rather than from the CNOC 100. The configuration data (bitstream) 18 may contain a command, which may be encrypted, to instruct the sector controller (SC) 58 to get data from the sector-aligned memory 92. In another example, a portion of the configuration data (bitstream) 18 may have an identifying sequence (e.g., a unique sequence, a hash, an encrypted value, a unique preamble, an initial set of bits belonging to a particular configuration data (bitstream) 18) that uniquely identifies the configuration data (bitstream) 18. From the unique sequence, the sector controller (SC) 58 may identify that the same configuration data (bitstream) 18 was previously received and cached in the sector-aligned memory 92, and thus may get data of the configuration data (bitstream) 18 from the sector-aligned memory 92. As such, upon the determination of a cache hit, the configuration memory (CRAM) 52 and/or in-fabric memory 114 may be programmed using data already stored in the sector-aligned memory 92 (block 146 of FIG. 10).

If there is not a cache hit (decision block 144), this may indicate a condition known as a "cache miss." In this disclosure, "cache miss" means that the configuration data (bitstream) 18 indicates to the sector controller (SC) 58 that the sector controller (SC) 58 should program the configuration memory (CRAM) 52 and/or in-fabric memory 114 using data from the CNOC 100 rather than the sector-aligned memory 92. For example, the configuration data (bitstream) 18 may contain a command, which may be encrypted, to instruct the sector controller (SC) 58 to get data from the CNOC 100 rather than from the sector-aligned memory 92. In another example, a portion of the configuration data (bitstream) 18 may have an identifying sequence (e.g., a unique sequence, a hash, an encrypted value, a unique preamble, an initial set of bits belonging to a particular configuration data (bitstream) 18) that uniquely identifies the configuration data (bitstream) 18. From the unique sequence, the sector controller (SC) 58 may identify that the same configuration data (bitstream) 18 was not previously received and/or cached in the sector-aligned memory 92.

Figure 10:
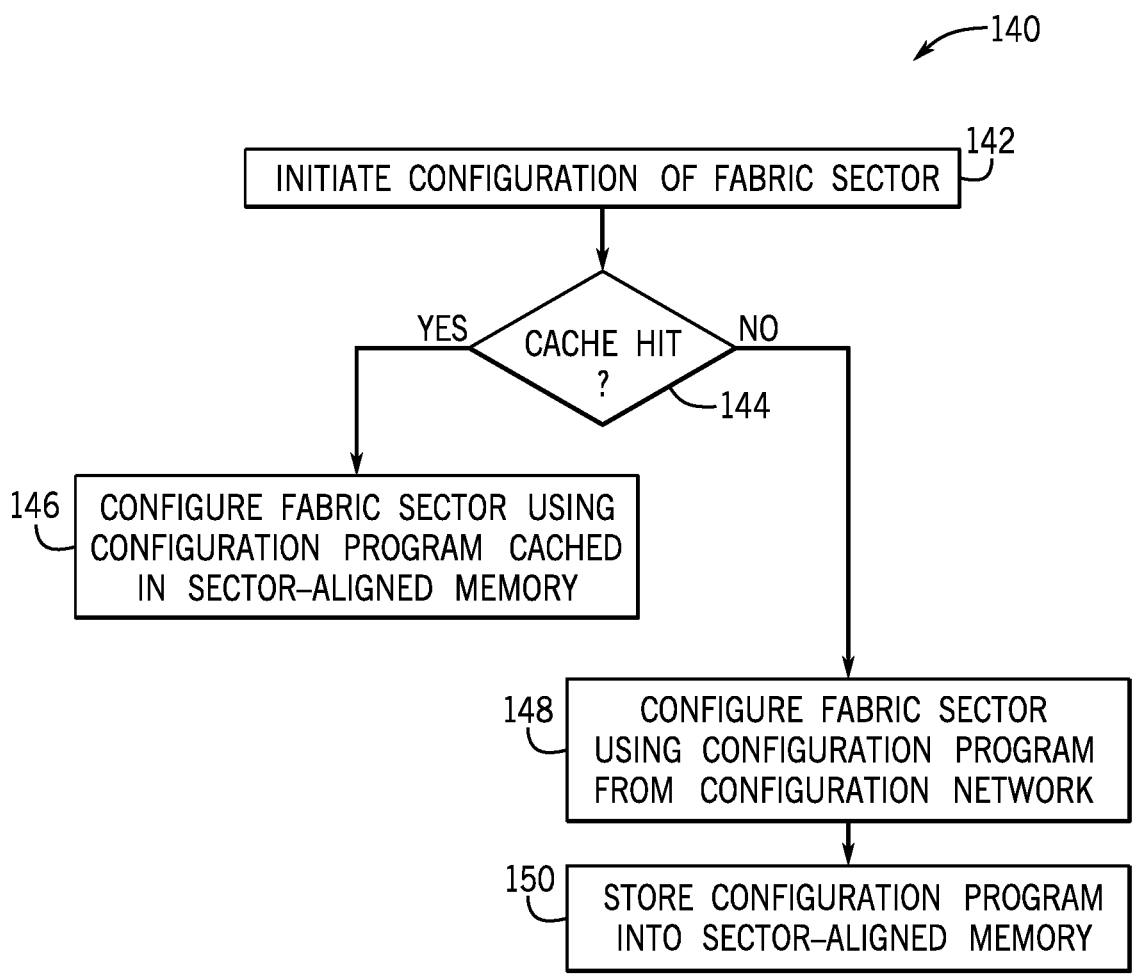
FIG. 10 is a flowchart of a method for performing rapid configuration and/or caching of a configuration program for a programmable logic device, in accordance with an embodiment.

As such, upon the determination of a cache miss, the configuration memory (CRAM) 52 and/or in-fabric memory 114 may be programmed using data (e.g., a remainder of the configuration data (bitstream) 18) from the CNOC 100 (block 148 of FIG. 10). Additionally or alternatively, the data (e.g., a remainder of the configuration data (bitstream) 18) from the CNOC 100 may be stored into the sector-aligned memory 92 while or after the data is programmed into the configuration memory (CRAM) 52 and/or in-fabric memory 114 (block 150 of FIG. 10).

Figure 11:
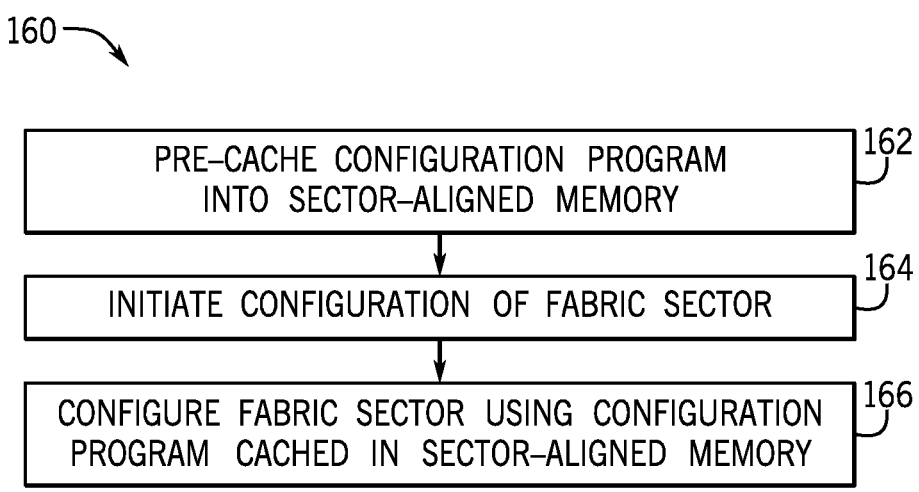
FIG. 11 is a flowchart of a method for pre-caching a configuration program before configuration of a programmable logic device, in accordance with an embodiment.

In an example shown by a flowchart 160 of FIG. 11, if desired, a configuration data (bitstream) 18 and/or data may be pre-cached (e.g., in a cache prefetch process) into the sector-aligned memory 92 in advance of configuration or programming (block 162 of FIG. 11). Thereafter, when provided with a certain configuration data (bitstream) 18 from the device controller (DC) 60 (e.g., a command, unique sequence, or the like) to initiate configuration (block 164 of FIG. 11), the sector controller (SC) 58 may cause the configuration memory (CRAM) 52 and/or the in-fabric memory 114 to be programmed with the pre-cached data from the sector-aligned memory 92 (block 166 of FIG. 11).

Figure 12:
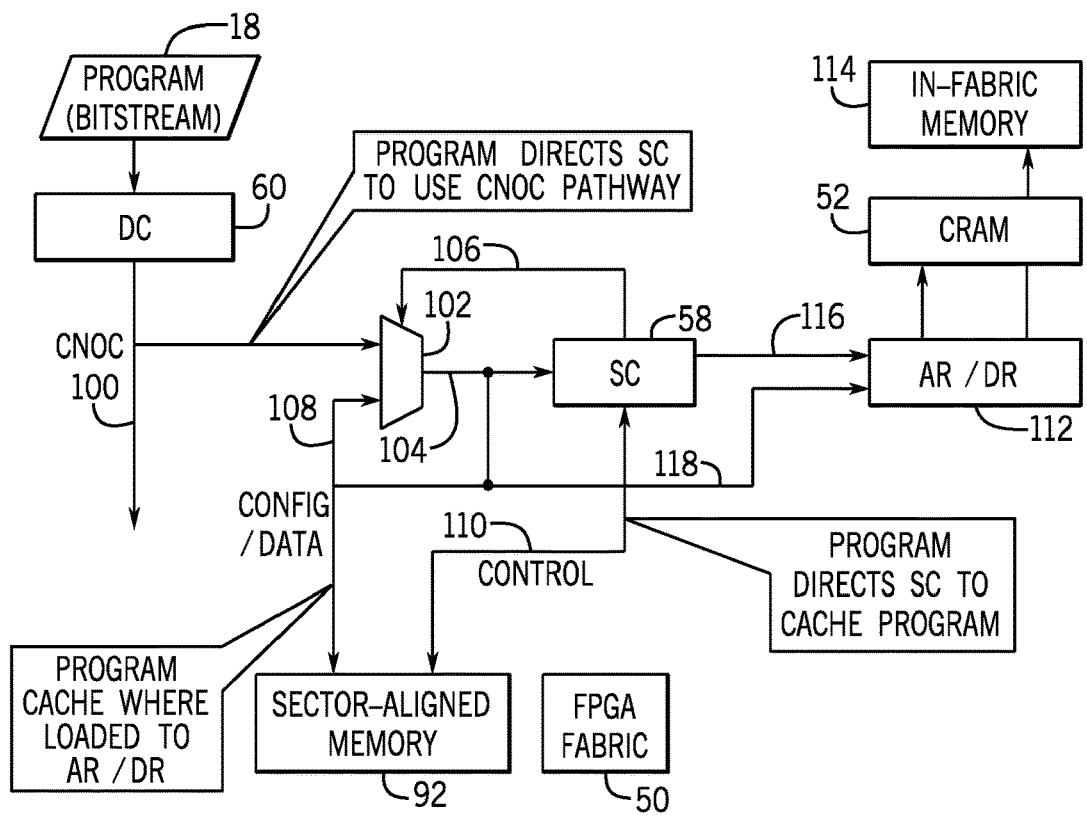
FIG. 12 is a block diagram illustrating an example of caching a configuration program upon a cache miss using the circuitry of FIG. 8, in accordance with an embodiment.

FIG. 12 represents an example of a "cache miss" using the circuitry described above with reference to FIG. 8. As such, additional description of elements with the same numbering as those in FIG. 8 may be found in the text above. With reference to FIG. 12, in a cache miss condition, the configuration data (bitstream) 18 may indicate to the sector controller (SC) 60 to use the CNOC 100 as a data source instead of the sector-aligned memory 92. As such, the sector controller (SC) 60 may direct the routing circuitry 102 to pass signals from the CNOC 100 on toward the AR/DR 112. Additionally or alternatively, the configuration data (bitstream) 18 may indicate to the sector controller (SC) 60 to cache the data from the CNOC 100 into the sector-aligned memory 92. The sector controller (SC) 60 may issue control signals to the sector-aligned memory 92 along the control pathway 110 and the sector-aligned memory 92 may receive the data from the CNOC 100 over the data pathway 108.

Figure 13:
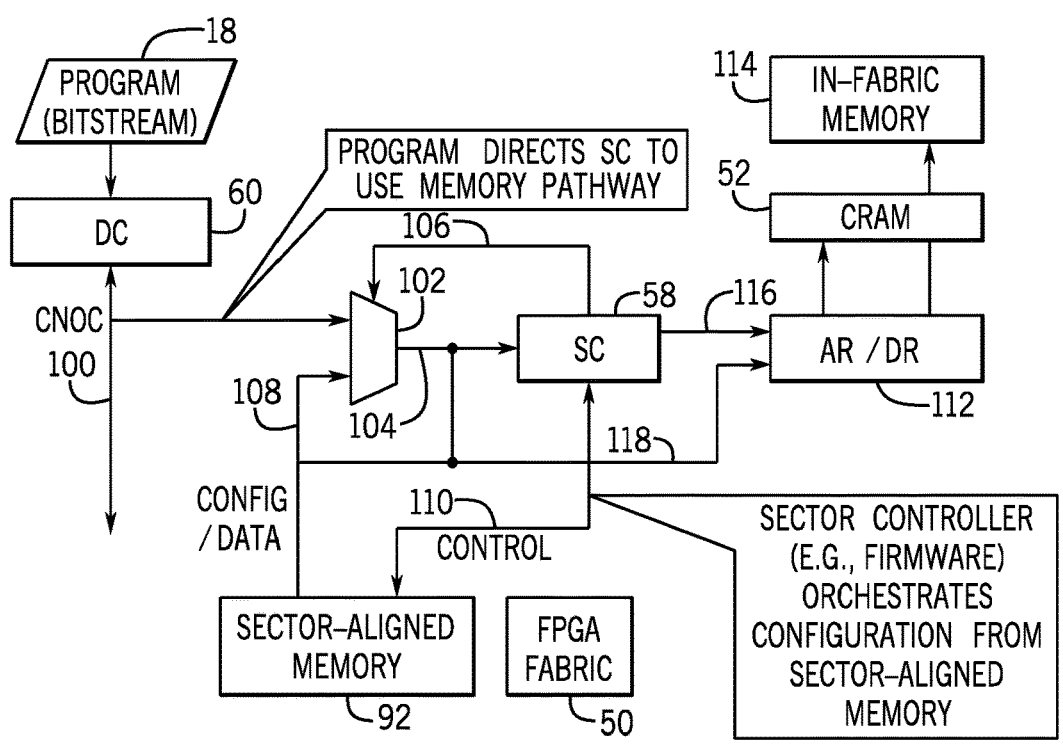
FIG. 13 is a block diagram illustrating an example of rapidly configuring a programmable logic device from the local memory with a configuration program upon a cache hit using the circuitry of FIG. 8, in accordance with an embodiment.

FIG. 13 represents an example of a "cache hit" using the circuitry described above with reference to FIG. 8. As such, additional description of elements with the same numbering as those in FIG. 8 may be found in the text above. With reference to FIG. 13, in a cache hit condition, the configuration data (bitstream) 18 may indicate to the sector controller (SC) 60 to use the sector-aligned memory 92 as a data source instead of the CNOC 100. As such, the sector controller (SC) 60 may direct the routing circuitry 102 to pass signals from the data pathway 108 to the AR/DR 112. The sector controller (SC) 60 may orchestrate the configuration of the configuration memory (CRAM) 52 and/or in-fabric memory 114 from the sector-aligned memory 92 using control signals on the control pathways 110 and 116.

Figure 14:
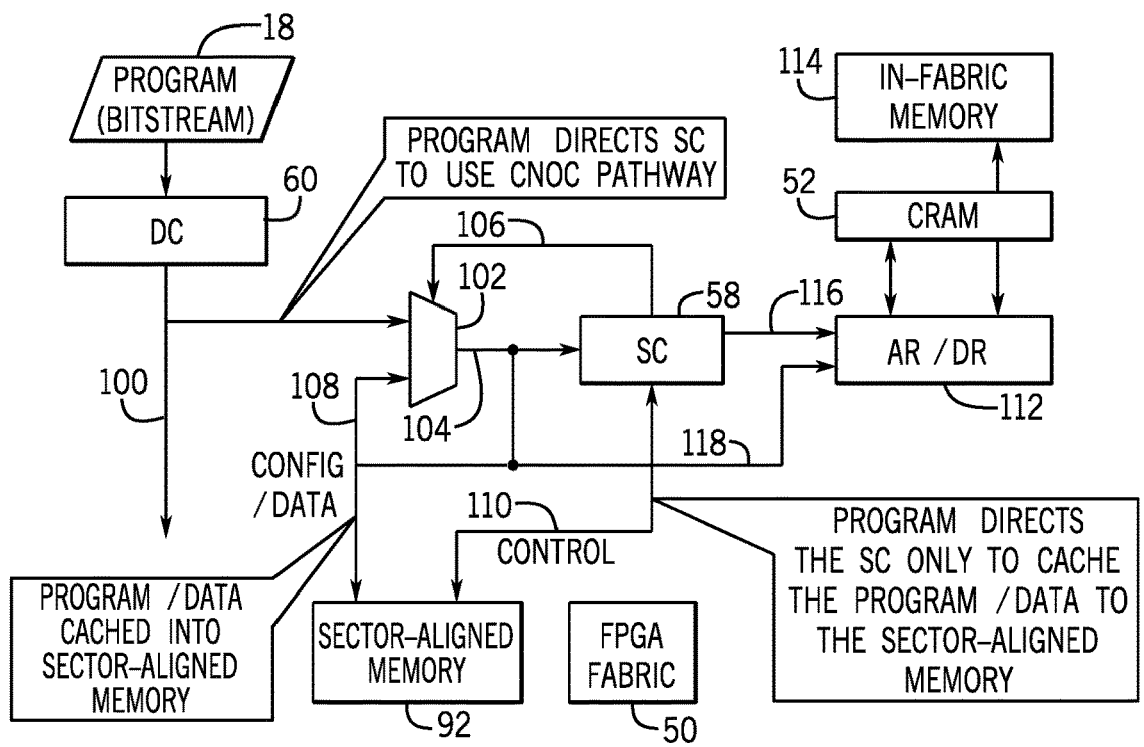
FIG. 14 is a block diagram illustrating an example of pre-caching a configuration program using the circuitry of FIG. 8, in accordance with an embodiment.

As noted above, a configuration data (bitstream) 18 and/or data may be pre-cached in a cache prefetch process. One example of this process using the circuitry of FIG. 8 is shown in FIG. 14. As such, additional description of elements with the same numbering as those in FIG. 8 may be found in the text above. With reference to FIG. 14, pre-caching in a cache prefetch process may involve the configuration data (bitstream) 18 indicating to the sector controller (SC) 60 to use the CNOC 100 as a data source instead of the sector-aligned memory 92. However, while the sector controller (SC) 60 may direct the routing circuitry 102 to pass signals from the CNOC 100 onto the data pathways 104 and 108, but may issue (or not issue) control signals on the control pathway 116 to the AR/DR 112, so that the AR/DR 112 may not program the configuration memory (CRAM) 52 and/or in-fabric memory 114. The sector controller (SC) 60 may issue control signals to the sector-aligned memory 92 along the control pathway 110 and the sector-aligned memory 92 may receive the data from the CNOC 100 over the data pathway 108.

Figure 15:
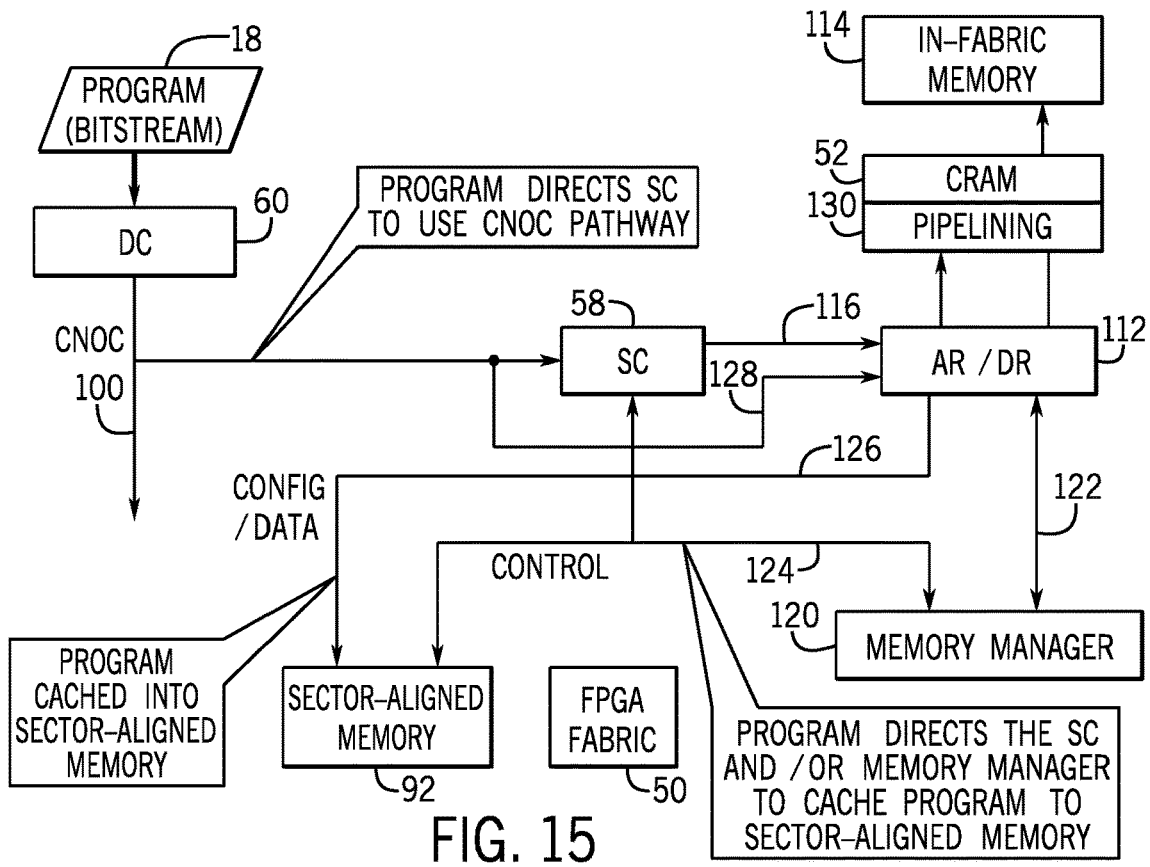
FIG. 15 is a block diagram illustrating an example of caching a configuration program upon a cache miss using the circuitry of FIG. 9, in accordance with an embodiment.

FIG. 15 represents an example of a "cache miss" using the circuitry described above with reference to FIG. 9. As such, additional description of elements with the same numbering as those in FIG. 9 may be found in the text above. With reference to FIG. 15, in a cache miss condition, the configuration data (bitstream) 18 may indicate to the sector controller (SC) 60 to use the CNOC 100 as a data source instead of the sector-aligned memory 92. As such, the sector controller (SC) 60 may coordinate with the memory manager 120 to program the configuration memory (CRAM) 52 and/or the in-fabric memory 114 using the AR/DR 112 with data from the CNOC 100. Additionally or alternatively, the configuration data (bitstream) 18 may indicate to the sector controller (SC) 60 to cache the data from the CNOC 100 into the sector-aligned memory 92. Thus, the sector controller (SC) 60 may issue control signals on the control pathway 124 to the sector-aligned memory 92, the memory manager 120, and/or the AR/DR 112. These circuit elements may coordinate to retrieve data from the AR/DR 112 and store it in the sector-aligned memory 92 along the data pathway 126. This may take place while the AR/DR 112 is programming the configuration memory (CRAM) 52 and/or the in-fabric memory 114 or after the AR/DR 112 has finished programming the configuration memory (CRAM) 52 and/or the in-fabric memory 114 (e.g., by reading it out into the sector-aligned memory 92).

Figure 16:
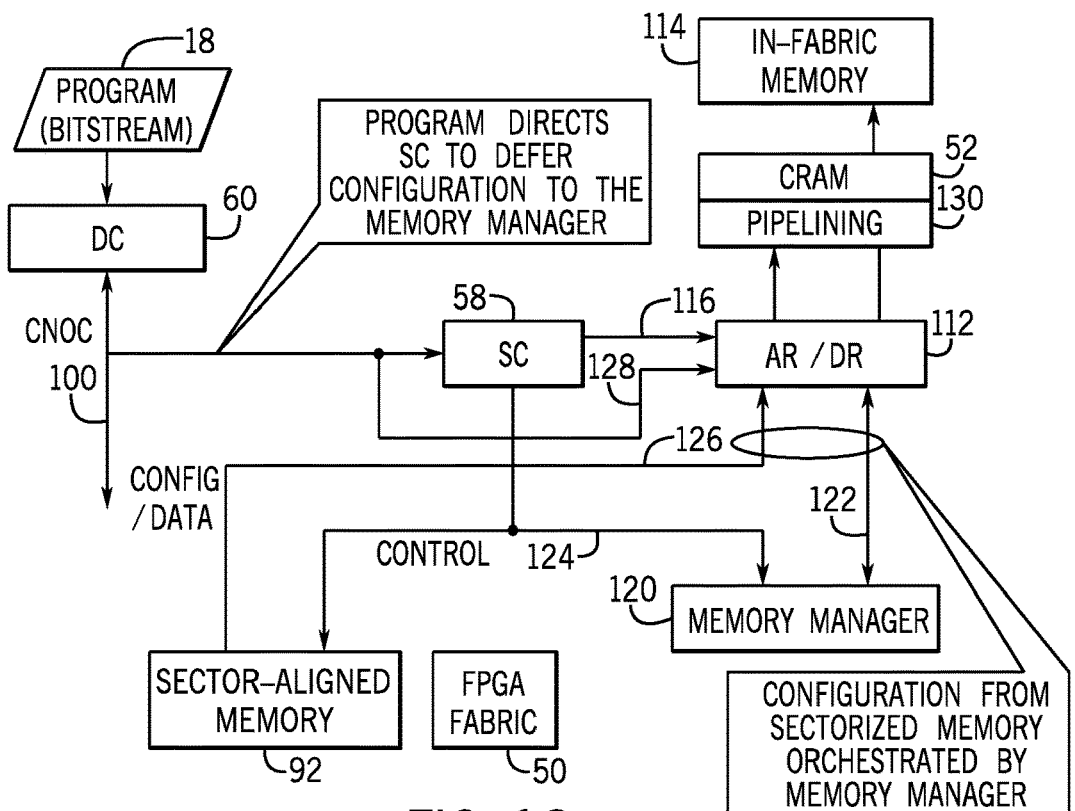
FIG. 16 is a block diagram illustrating an example of rapidly configuring a programmable logic device from the local memory with a configuration program upon a cache hit using the circuitry of FIG. 9, in accordance with an embodiment.

FIG. 16 represents an example of a "cache hit" using the circuitry described above with reference to FIG. 9. As such, additional description of elements with the same numbering as those in FIG. 9 may be found in the text above. With reference to FIG. 16, in a cache hit condition, the configuration data (bitstream) 18 may indicate to the sector controller (SC) 60 to use the sector-aligned memory 92 as a data source instead of the CNOC 100. As such, the sector controller (SC) 60 may direct the memory manager 120 to orchestrate programming with the AR/DR 112 using data from the sector-aligned memory 92.

Figure 17:
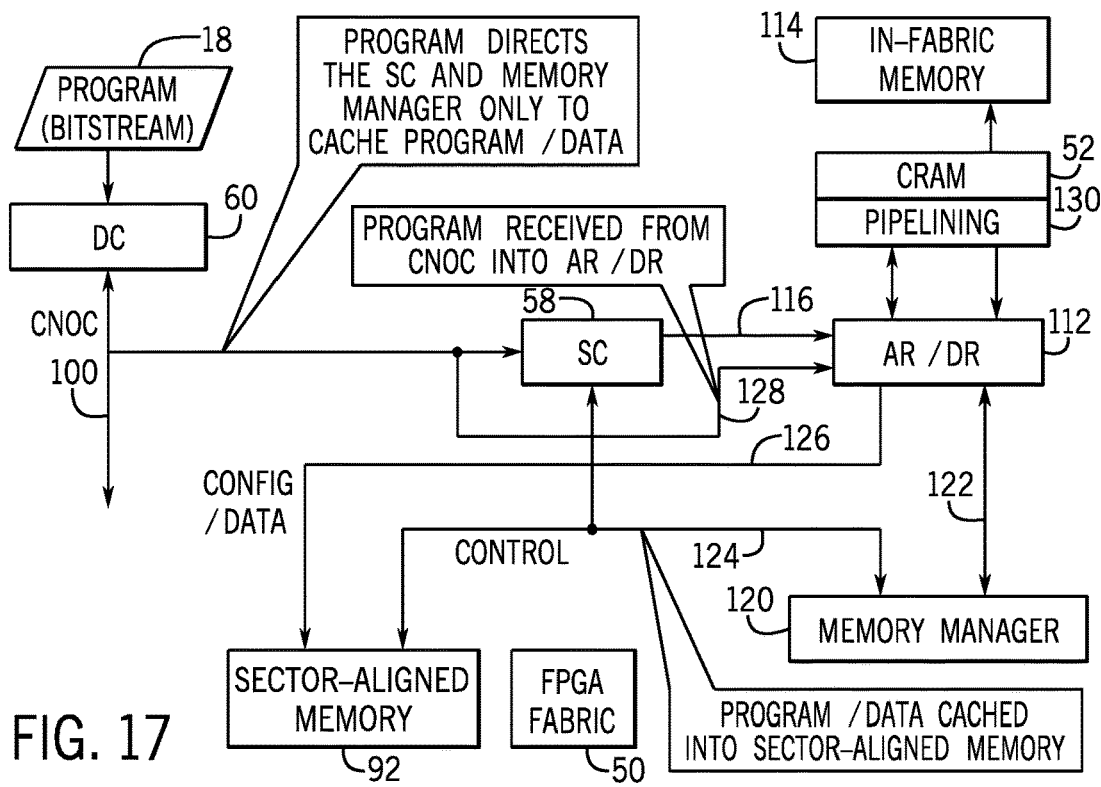
FIG. 17 is a block diagram illustrating an example of pre-caching a configuration program using the circuitry of FIG. 9, in accordance with an embodiment.

Pre-caching a configuration data (bitstream) 18 in a cache prefetch process using the circuitry of FIG. 9 is shown in FIG. 17. Additional description of elements with the same numbering as those in FIG. 9 may be found in the text above. With reference to FIG. 17, pre-caching in a cache prefetch process may involve the configuration data (bitstream) 18 indicating to the sector controller (SC) 60 to use the CNOC 100 as a data source instead of the sector-aligned memory 92. However, while the sector controller (SC) 60 may direct the memory manager 120 and the AR/DR 112 to receive data signals from the CNOC 100, the AR/DR 112 may not program the configuration memory (CRAM) 52 and/or in-fabric memory 114. Instead, the sector controller (SC) 60 may issue control signals to the sector-aligned memory 92, memory manager 120, and the AR/DR 112, and the data may be moved from the AR/DR 112 into the sector-aligned memory 92.

Figure 18:
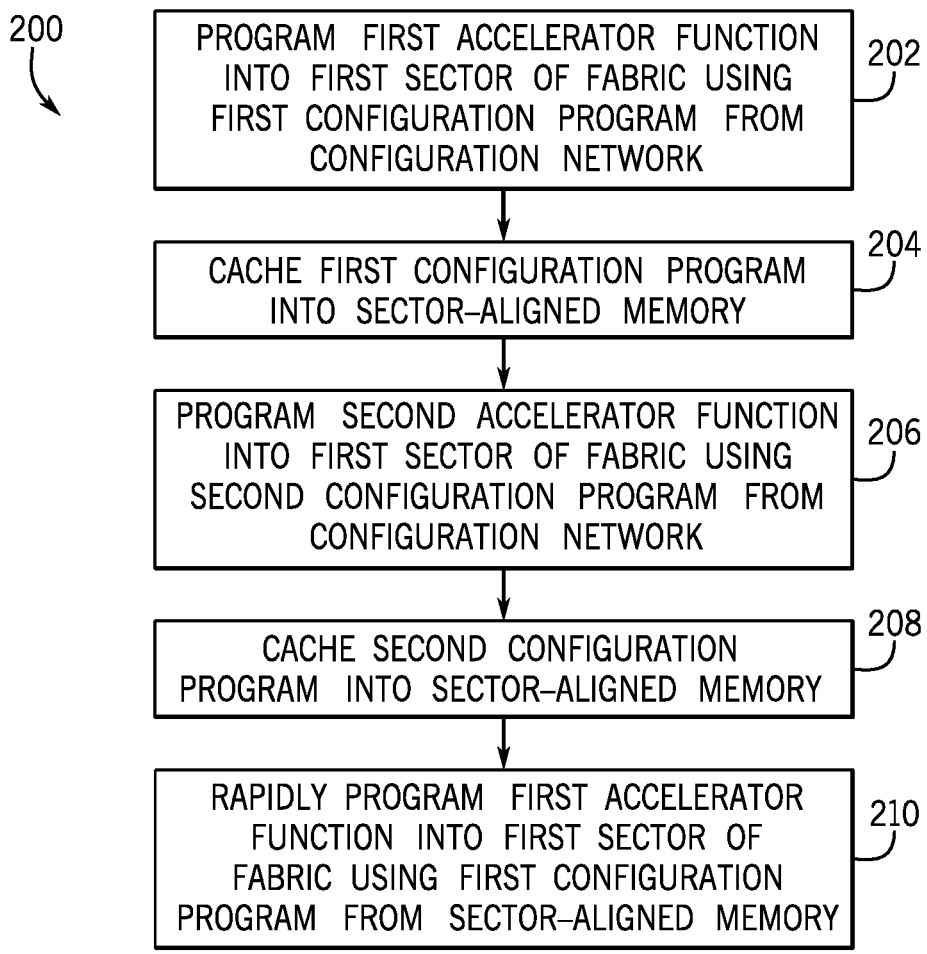
FIG. 18 is a flowchart of a method for rapidly switching between one configuration of a programmable logic device and another configuration of the programmable logic device, in accordance with an embodiment.

Using the caching and pre-caching systems and methods of this disclosure, a programmable logic device may be rapidly reprogrammed with different accelerators to perform a variety of tasks. Specialized accelerators may perform diverse computational tasks, such as machine learning, video processing, voice recognition, image recognition, data compression, database search ranking, bioinformatics, network security pattern identification, spatial navigation, or the like. In a method shown by a flowchart 200 of FIG. 18, at a first time, a first accelerator function may be initially received over a configuration network on chip (CNOC) and programmed into the programmable logic device (block 202 of FIG. 18). The first accelerator function may also be cached into sector-aligned memory (block 204 of FIG. 18). At a second time, a second accelerator function may be initially received over a configuration network on chip (CNOC) and programmed over the first accelerator function into the programmable logic device (block 206 of FIG. 18). The second accelerator function may also be cached into sector-aligned memory (block 208 of FIG. 18). Thereafter, when the first accelerator function is to be reprogrammed onto the programmable logic device, this may occur very rapidly, at least partially deriving from the sector-aligned memory instead of entirely from the CNOC (block 210 of FIG. 18).

Figure 19:
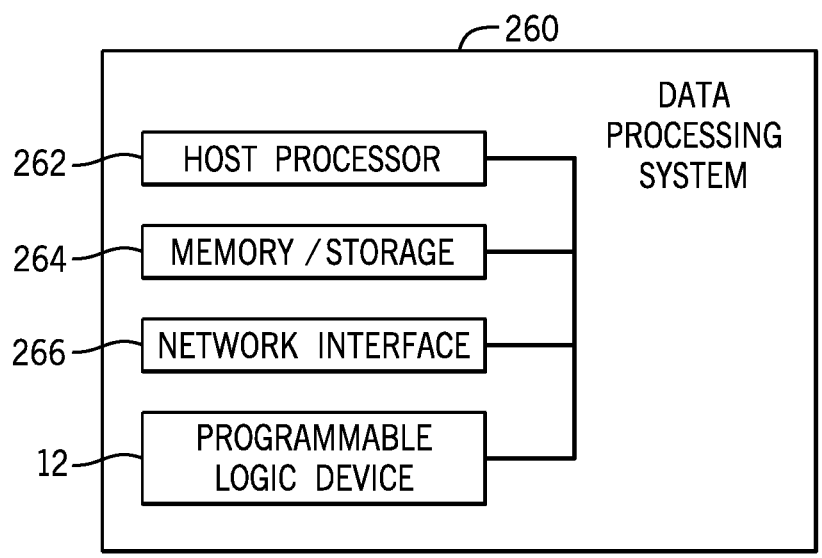
FIG. 19 is a block diagram of a data processing system that may use the programmable logic device to rapidly respond to data processing requests, in accordance with an embodiment.

The programmable logic device 12 may be, or may be a component of, a data processing system. For example, the programmable logic device 12 may be a component of a data processing system 260, shown in FIG. 19. The data processing system 260 includes a host processor 262, memory and/or storage circuitry 264, and a network interface 266. The data processing system 260 may include more or fewer components (e.g., electronic display, user interface structures, application specific integrated circuits (ASICs)). The host processor 262 may include any suitable processor, such as an Intel® Xeon® processor or a reduced-instruction processor (e.g., a reduced instruction set computer (RISC), an Advanced RISC Machine (ARM) processor) that may manage a data processing request for the data processing system 260 (e.g., to perform machine learning, video processing, voice recognition, image recognition, data compression, database search ranking, bioinformatics, network security pattern identification, spatial navigation, or the like). The memory and/or storage circuitry 264 may include random access memory (RAM), read-only memory (ROM), one or more hard drives, flash memory, or the like. The memory and/or storage circuitry 264 may hold data to be processed by the data processing system 260. In some cases, the memory and/or storage circuitry 264 may also store configuration programs (bitstreams) for programming the programmable logic device 12. The network interface 266 may allow the data processing system 260 to communicate with other electronic devices. The data processing system 260 may include several different packages or may be contained within a single package on a single package substrate.

In one example, the data processing system 260 may be part of a data center that processes a variety of different requests. For instance, the data processing system 260 may receive a data processing request via the network interface 266 to perform machine learning, video processing, voice recognition, image recognition, data compression, database search ranking, bioinformatics, network security pattern identification, spatial navigation, or some other specialized task. The host processor 262 may cause the programmable logic fabric of the programmable logic device 12 to be programmed with a particular accelerator related to requested task. For instance, the host processor 262 may instruct that a configuration data (bitstream) stored on the memory/storage 264 or cached in sector-aligned memory of the programmable logic device 12 to be programmed into the programmable logic fabric of the programmable logic device 12. The configuration data (bitstream) may represent a circuit design for a particular accelerator function relevant to the requested task. Due to the high density of the programmable logic fabric, the proximity of the substantial amount of sector-aligned memory to the programmable logic fabric, or other features of the programmable logic device 12 that are described here, the programmable logic device 12 may rapidly assist the data processing system 260 in performing the requested task. Indeed, in one example, programming an accelerator to assist with a voice recognition task may take place faster than a few milliseconds (e.g., on the order of microseconds) by caching and programming the accelerator using sector-aligned memory.

The methods and devices of this disclosure may be incorporated into any suitable circuit. For example, the methods and devices may be incorporated into numerous types of devices such as microprocessors or other integrated circuits. Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), and microprocessors, just to name a few.

Moreover, while the method operations have been described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of overlying operations is performed as desired.

The embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). For any claims containing elements designated in any other manner, however, it is intended that such elements are not to be interpreted under 35 U.S.C. 112(f).

What is claimed is:

1. An integrated circuit device comprising:
programmable logic fabric disposed on a first integrated circuit die, the programmable logic fabric comprising configuration memory and programmable logic elements controlled by the configuration memory, wherein a first sector of configuration memory of a plurality of sectors of the configuration memory is configurable to be programmed with first configuration data; and
sector-aligned memory apart from the programmable logic fabric and disposed on a second integrated circuit die, the sector-aligned memory comprises a first sector of sector-aligned memory of a plurality of sectors of sector-aligned memory configurable to cache the first configuration data on the second integrated circuit die while the first sector of the configuration memory is programmed with the first configuration data a first time, wherein the second integrated circuit die comprises programmable logic fabric support circuitry to support operability of the programmable logic fabric on the first integrated circuit die.

2. The integrated circuit device of claim 1, wherein:
the first integrated circuit die and the second integrated circuit die are vertically stacked; and
the first sector of the configuration memory is aligned with the first sector of sector-aligned memory.

3. The integrated circuit device of claim 1, wherein the first sector of sector-aligned memory has a capacity greater than or equal to a capacity of the first sector of configuration memory.

4. The integrated circuit device of claim 1, wherein:
the first sector of the configuration memory is configurable to be programmed with the first configuration data at the first time by receiving the first configuration data via a data source external to the integrated circuit device; and
the first sector of the configuration memory is configurable to be programmed with the first configuration data at a second time by receiving the cached first configuration data from the first sector of sector-aligned memory.

5. The integrated circuit device of claim 1, wherein:
the first sector of the configuration memory is configurable to be programmed with the first configuration data at the first time by receiving the first configuration data via a configuration network on chip; and
the first sector of the configuration memory is configurable to be programmed with the first configuration data at a second time by receiving the cached first configuration data from the first sector of sector-aligned memory.

6. The integrated circuit device of claim 1, wherein:
a second sector of the configuration memory of the plurality of sectors of the configuration memory is configurable to be programmed with second configuration data; and
the sector-aligned memory comprises a second sector of sector-aligned memory of the plurality of sectors of sector-aligned memory configurable to cache the second configuration data while the second sector of the configuration memory is programmed with the second configuration data a first time.

7. The integrated circuit device of claim 6, wherein the first sector of sector-aligned memory is configurable to cache the first configuration data while the second sector of sector-aligned memory caches the second configuration data.

8. The integrated circuit device of claim 1, wherein the first sector of the configuration memory is configurable to be programmed in a pipelined manner.

9. A method for rapidly programming a programmable logic device, the method comprising:
receiving first configuration data into the programmable logic device disposed on a first integrated circuit die from a data source external to the programmable logic device;
caching the first configuration data into a first sector of sector-aligned memory of a plurality of sectors of sector-aligned memory of the programmable logic device disposed on a second integrated circuit die, the first sector of sector-aligned memory corresponding to a first sector of configuration memory of a plurality of sectors of the configuration memory of programmable logic fabric of the programmable logic device;
configuring the first sector of configuration memory using the first configuration data cached in the first sector of the sector-aligned memory; and
supporting at least one operation of the programmable logic fabric on the first integrated circuit die using programmable logic fabric support circuitry of the second integrated circuit die.

10. The method of claim 9, wherein the first configuration data is cached into the first sector of the sector-aligned memory at a first time while the configuration memory of the first sector is programmed using the first configuration data at the first time, wherein configuring the first sector of the programmable logic fabric of the programmable logic device by programming the configuration memory of the first sector using the first configuration data cached in the first sector of the sector-aligned memory occurs at a second time.

11. The method of claim 9, wherein the first configuration data is cached into the first sector of sector-aligned memory before the first sector of the programmable logic fabric is configured using the first configuration data at a first time.

12. The method of claim 9, wherein:
the first configuration data is cached into the first sector of sector-aligned memory while the first sector of the programmable logic fabric is configured using the first configuration data at a first time; and
the first sector of the programmable logic fabric is configured using the first configuration data at a second time subsequent to the first time by programming the configuration memory of the first sector using the first configuration data cached in the first sector of sector-aligned memory.

13. The method of claim 9, wherein the first configuration data is cached into the first sector of sector-aligned memory in response to an indication by the first configuration data that the first configuration data is to be cached.

14. The method of claim 13, wherein the indication comprises a command that instructs the first configuration data to be cached or an identifying sequence that indicates that the first configuration data is not already stored in the first sector of the sector-aligned memory, or both.

15. The method of claim 14, comprising:
receiving second configuration data into the programmable logic device from the data source external to the programmable logic device; and
configuring the first sector of the programmable logic fabric of the programmable logic device by programming the configuration memory of the first sector using the second configuration data;
wherein, after the first sector is configured using the second configuration data, the first sector of the programmable logic fabric of the programmable logic device is configured by programming the configuration memory of the first sector using the first configuration data cached in the first sector of the sector-aligned memory.

16. A data processing system comprising:
a processor configurable to manage a data processing request;
a memory or storage device configurable to store first configuration data relating to the data processing request; and
a programmable logic device comprising programmable logic fabric disposed on a first integrated circuit die, wherein a first sector of configuration memory of a plurality of sectors of configuration memory is configurable to be programmed with the first configuration data in response to an instruction by the processor, wherein the programmable logic device is configurable to receive the first configuration data from the memory or storage device disposed on a second integrated circuit die and cache the first configuration data in a first sector of sector-aligned memory of a plurality of sectors of sector aligned memory in fabric cache memory of the programmable logic device before or while programming the first sector of configuration memory with the first configuration data, wherein the second integrated circuit die comprises programmable logic fabric support circuitry to support operations of the programmable logic fabric on the first integrated circuit die.

17. The data processing system of claim 16, wherein the instruction by the processor comprises an instruction to program the first configuration data into the first sector of configuration memory using a version of the first configuration data that is cached in the fabric cache memory.

18. The data processing system of claim 16, wherein the instruction by the processor comprises an instruction to cache the first configuration data in the fabric cache memory while programming the first configuration data into the first sector of configuration memory using a version of the first configuration data received from the memory or storage device.

19. The data processing system of claim 16, wherein the data processing request comprises machine learning, video processing, voice recognition, image recognition, data compression, database search ranking, bioinformatics, network security pattern identification, spatial navigation, or a combination thereof.

* * * * *